(12) United States Patent  
Yin et al.

(10) Patent No.: US 8,198,673 B2  
(45) Date of Patent: Jun. 12, 2012

(54) ASYMMETRIC EPITAXY AND APPLICATION THEREOF

(75) Inventors: Haizhou Yin, Poughkeepsie, NY (US); Xinhui Wang, Yorktown Heights, NY (US); Kevin K. Chan, Yorktown Heights, NY (US); Zhibin Ren, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/080,702

(22) Filed: Apr. 6, 2011

(65) Prior Publication Data

US 2011/0180872 A1     Jul. 28, 2011

Related U.S. Application Data

(62) Division of application No. 12/614,699, filed on Nov. 9, 2009, now Pat. No. 7,989,297.

(51) Int. Cl.  
*H01L 21/00* (2006.01)

(52) U.S. Cl. ................. 257/327; 257/E21.561; 257/347

(58) Field of Classification Search .......... 257/336–347, 257/327, E21.561  
See application file for complete search history.

(56) References Cited

U.S. PATENT DOCUMENTS

| | | | |
|---|---|---|---|
| 5,115,296 A | | 5/1992 | Hsue et al. |
| 5,124,276 A | * | 6/1992 | Samata et al. ............... 438/607 |
| 6,087,237 A | | 7/2000 | Hwang |
| 6,368,926 B1 | * | 4/2002 | Wu ............................... 438/300 |
| 7,208,397 B2 | | 4/2007 | Feudel et al. |
| 7,220,648 B2 | | 5/2007 | Kim |
| 7,354,839 B2 | | 4/2008 | Wei et al. |
| 2002/0093018 A1 | * | 7/2002 | Choi ............................. 257/66 |
| 2006/0081930 A1 | | 4/2006 | Maegawa et al. |
| 2006/0258072 A1 | | 11/2006 | Kavalieros et al. |
| 2008/0093640 A1 | | 4/2008 | Babich et al. |
| 2008/0179650 A1 | | 7/2008 | Kawakita |
| 2008/0290408 A1 | | 11/2008 | Hsu et al. |
| 2009/0020830 A1 | | 1/2009 | Anderson et al. |
| 2009/0130805 A1 | | 5/2009 | Babcock et al. |

FOREIGN PATENT DOCUMENTS

| | | |
|---|---|---|
| KR | 10-0552825 | 2/2006 |
| KR | 10-20060072411 | 6/2006 |

* cited by examiner

*Primary Examiner* — Richard A. Booth  
(74) *Attorney, Agent, or Firm* — Yuanuin Cai

(57) ABSTRACT

The present invention provides a method of forming asymmetric field-effect-transistors. The method includes forming a gate structure on top of a semiconductor substrate, the gate structure including a gate stack and spacers adjacent to sidewalls of the gate stack, and having a first side and a second side opposite to the first side; performing angled ion-implantation from the first side of the gate structure in the substrate, thereby forming an ion-implanted region adjacent to the first side, wherein the gate structure prevents the angled ion-implantation from reaching the substrate adjacent to the second side of the gate structure; and performing epitaxial growth on the substrate at the first and second sides of the gate structure. As a result, epitaxial growth on the ion-implanted region is much slower than a region experiencing no ion-implantation. A source region formed to the second side of the gate structure by the epitaxial growth has a height higher than a drain region formed to the first side of the gate structure by the epitaxial growth. A semiconductor structure formed thereby is also provided.

8 Claims, 9 Drawing Sheets

ASYMMETRIC EPITAXY AND APPLICATION THEREOF

CROSS REFERENCE TO RELATED APPLICATION

This application is a divisional application of U.S. patent application Ser. No. 12/614,699, filed Nov. 9, 2009, the content of which is incorporated herein by reference in its entirety.

FIELD OF THE INVENTION

The present invention relates generally to the field of semiconductor device manufacturing, and in particular relates to method of manufacturing field-effect-transistors through asymmetric epitaxial growth.

BACKGROUND OF THE INVENTION

With shrinking dimensions of various integrated circuit components, transistors such as field-effect transistors (FETs) have experienced, over time, dramatic improvement in both performance and power consumption. These improvements may be largely attributed to the reduction in dimensions of components used therein, which in general translate into reduced capacitance, resistance, and increased throughput current from the transistors. Nevertheless, performance improvement brought up by this type of "classic" scaling, in device dimensions, has recently met obstacles and in some cases even been challenged, when the scaling goes beyond a certain point, by the increase in leakage current and variability that are inevitably associated with this continued reduction in device dimensions.

In general, power consumption and performance of integrated circuits stem from and depend upon capacitance, resistance, and leakage current of components, such as electrical junctions, wires, property of dielectric material, etc., that the integrated circuits may contain. In the case of a field-effect-transistor, it has been discovered that capacitance in the drain side and resistance in the source side, in particular, contribute largely to the overall performance of the FET, and reductions in capacitance in the drain side and resistance in the source side may help further improve performance of the FET.

SUMMARY OF THE INVENTION

Embodiments of the present invention provide a method of forming asymmetric field-effect-transistor. The method includes forming a gate structure on top of a semiconductor substrate, the gate structure including a gate stack and spacers adjacent to sidewalls of the gate stack, and having a first side and a second side opposite to the first side; performing angled ion-implantation from the first side of the gate structure in the substrate, thereby forming an ion-implanted region adjacent to the first side, wherein the gate structure prevents the angled ion-implantation from reaching the substrate adjacent to the second side of the gate structure; and performing epitaxial growth on the substrate at the first and second sides of the gate structure.

In one embodiment, performing epitaxial growth creates a source (or source extension) region in the second side of the gate structure and a drain (or drain extension) region in the first side of the gate structure, the source region formed by the epitaxial growth having a height higher than the drain region formed by the epitaxial growth. In one embodiment, the source region and the drain region cover at least a portion of sides of the spacers at the first and second sides of the gate structure.

According to one embodiment, the method further includes creating recesses in the first and second sides of the gate structure before performing the angled ion-implantation. In one aspect, the ion-implanted region is formed at a top surface of the recesses.

In another embodiment, performing epitaxial growth includes growing a drain region in the first side and a source region in the second side of the gate structure, the drain region having a height lower than that of the source region. In one embodiment, the substrate is a silicon-on-insulator (SOI) substrate, and the method further includes performing ion-implantation in the source region and the drain region, wherein the ion-implantation creates a PN-junction that extends downwardly and is in touch with an insulating layer inside the SOI substrate. In another embodiment, performing angled ion-implantation includes implanting ions of As or $BF_2$ into the substrate in an area adjacent to the first side of the gate structure at substantially close to a surface of the substrate.

BRIEF DESCRIPTION OF THE DRAWINGS

The invention will be understood and appreciated more fully from the following detailed description of the invention, taken in conjunction with the accompanying drawings of which.

Figure 1:
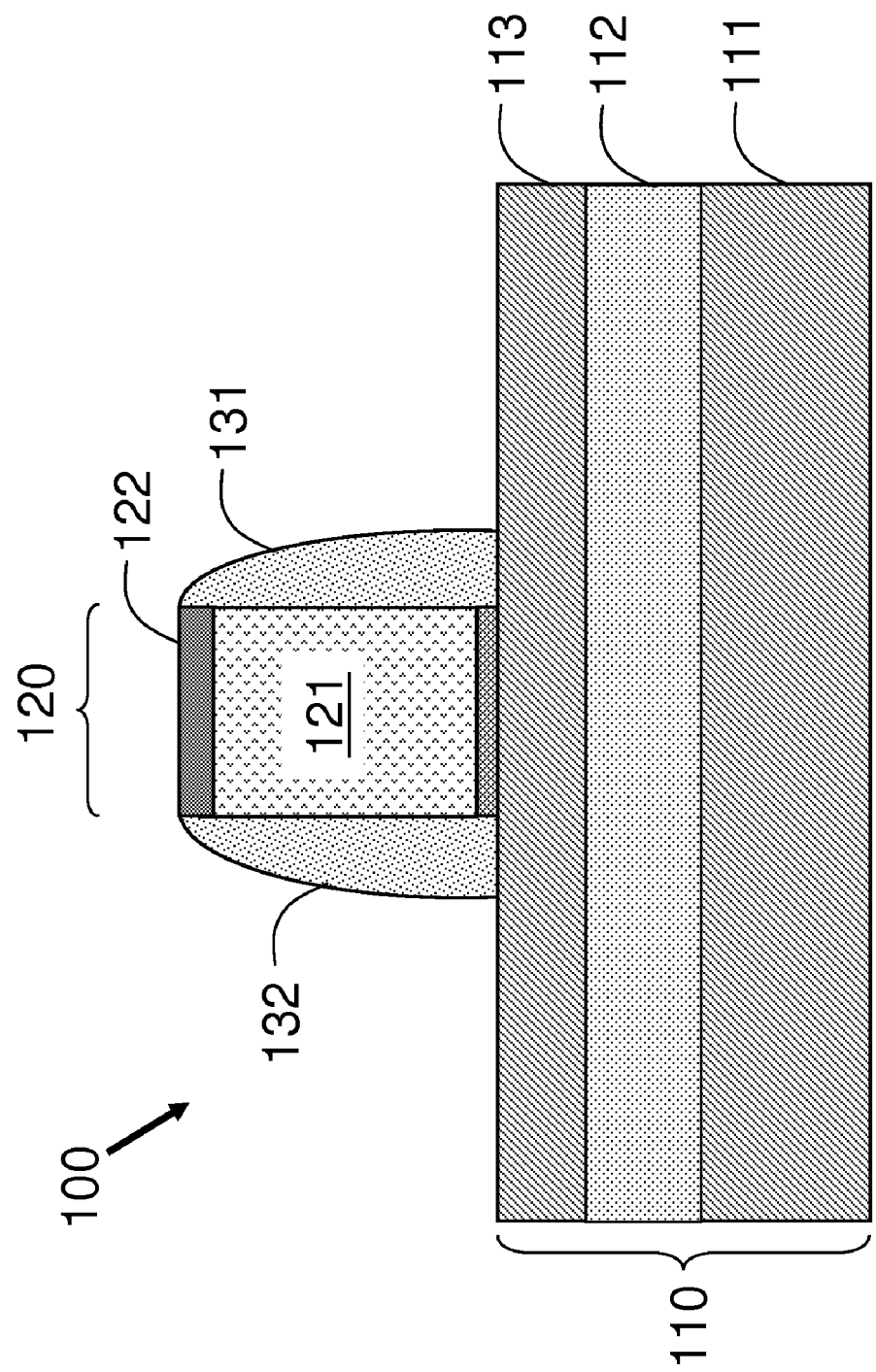
FIG. 1 is a demonstrative illustration of a method of forming a field-effect-transistor with asymmetric height-raised source/drain according to an embodiment of the invention.

It will be appreciated that for the purpose of simplicity and clarity of illustration, elements in the drawings have not necessarily been drawn to scale. For example, dimensions of some of the elements may be exaggerated relative to other elements for clarity purpose.

DETAILED DESCRIPTION OF THE INVENTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or patent applications for reference in order not to obscure description of essences and/or embodiments of the invention. It is to be understood that the following descriptions have rather focused on distinctive features and/or elements of various embodiments of the invention.

FIG. 1 is a demonstrative illustration of a method of forming a field-effect-transistor (FET) with asymmetric height-raised source/drain according to one embodiment of the invention. For example, the method may include providing a semiconductor substrate 110 upon which one or more field-effect-transistors may subsequently be formed to have asymmetric height-raised source/drain. Semiconductor substrate 110 may be, for example, a silicon substrate, a silicon-on-insulator (SOI) substrate, or any other substrates that may be deemed suitable for forming semiconductor devices thereupon. In FIG. 1, as an example, semiconductor substrate 110 is illustrated to include a first silicon layer 111, an insulating layer 112 on top of silicon layer 111, and a second silicon layer 113 on top of insulating layer 112. Insulating layer 112 may be made of silicon-dioxide ($SiO_2$), silicon-nitride, or any other insulating materials and second silicon layer 113, for reason of being formed on top of insulator 112, may be referred to as a silicon-on-insulator (SOI) layer.

Next, in order to form a field-effect-transistor 100 with asymmetric height-raised source/drain, the method may include forming a gate stack 120 on top of substrate 110 by applying one or more processes of front-end-of-line (FEOL) technologies. Gate stack 120 may include at least a gate dielectric layer, a gate conductor layer 121, and a hardmask layer 122. Hardmask layer 122, such as a silicon-nitride (SiN) hardmask, may be formed on top of gate conductor 121 to prevent, during a subsequent step of forming source/drain of FET 100, potential epitaxial growth of silicon on top of gate conductor 121 (which may be silicon as well). After forming gate stack 120, spacers 131 and 132 may be formed at the sidewalls of gate stack 120. Spacers 131 and 132 are formed to define regions, for example to the left and to the right of gate stack 120, where source and drain of FET 100 may be formed respectively, as being described below in more details.

Here, it is worth noting that a person skilled in the art will appreciate that embodiments of the present invention, as being described above and in more details hereafter, are not limited in the above aspect of forming asymmetric source/drain of a FET. Embodiments of the present invention may be similarly applied in other areas such as in forming asymmetric source/drain extensions, in addition to source/drain of a FET. For instance in the above example, when spacers 131 and 132 are formed as off-set spacers which has a substantially thin thickness, the below described process may be similarly applied in forming asymmetric source/drain extensions, in replacement of or in addition to asymmetric source/drain, of FET 100. However, hereinafter, in order not to obscure essence of the present invention, the below description will be focused mainly on forming asymmetric source/drain of a field-effect-transistor.

Figure 2:
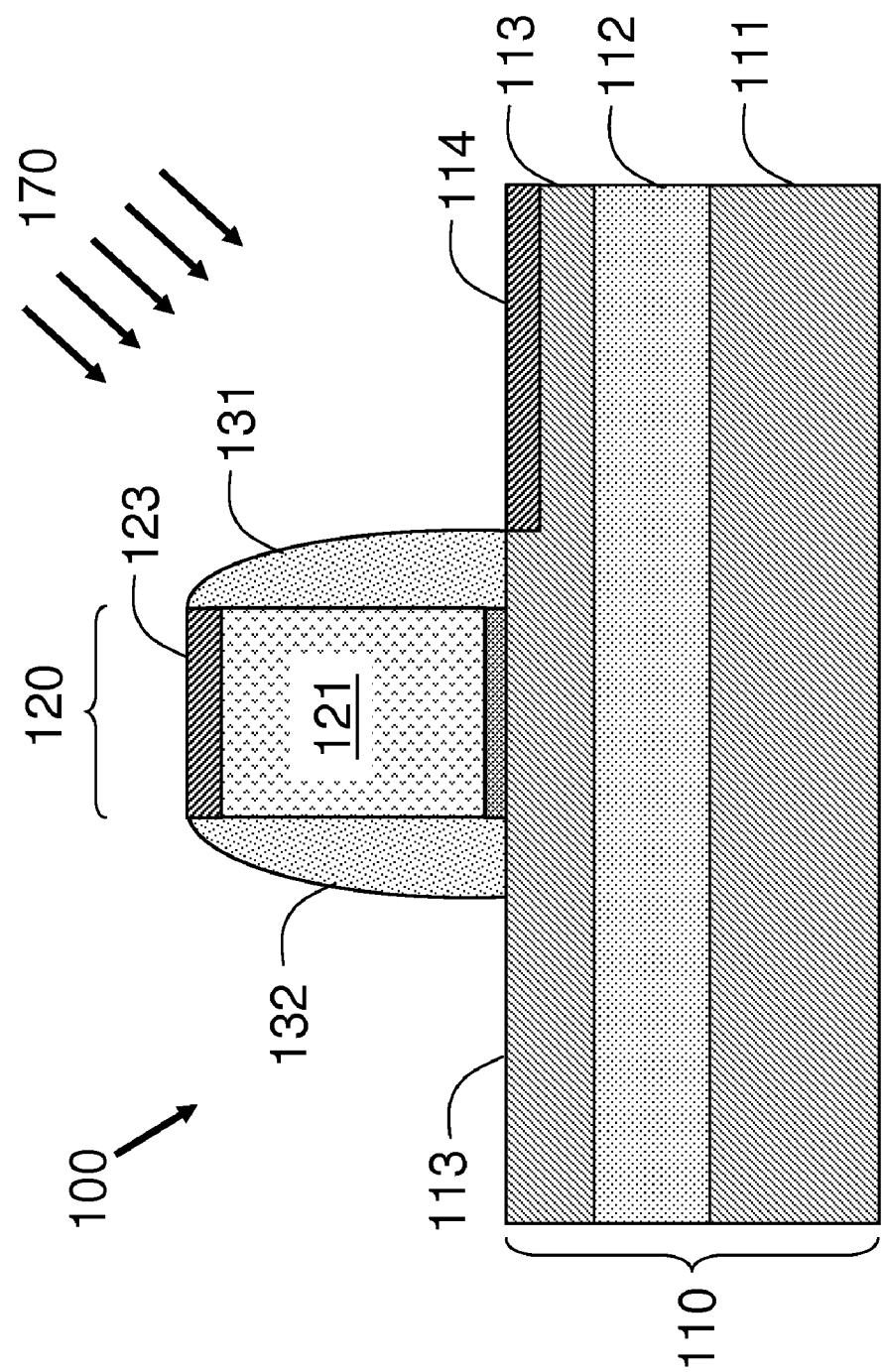
FIG. 2 is a demonstrative illustration of a method of forming a field-effect-transistor with asymmetric height-raised source/drain according to another embodiment of the invention.

FIG. 2 is a demonstrative illustration of a method of forming a field-effect-transistor with asymmetric height-raised source/drain according to another embodiment of the invention. For example, after forming gate stack 120 with spacers 131 and 132 at the sidewalls as shown in FIG. 1, the method may include performing angled ion-implantation 170 from the drain side of FET 100. In one aspect, with gate stack 120 functioning as a blocking mask, angled ion-implantation 170 may only create implanted region 114 to the right side of gate stack 120 in the drain region of silicon layer 113. For example, with a height of gate stack of for example 50 nm, which is typical for 20 nm and/or 30 nm nodes application, angled ion-implantation 170 with an angle larger than approximately 45 degrees (measured from a normal to substrate 110) may be sufficient to cause almost no or little ion implantation in regions to the left side of gate stack 120, that is, the source region of silicon layer 113. During ion-implantation, hardmask layer 122 on top of gate stack 120 may become implanted as well and is shown in FIG. 2 as region 123.

According to one embodiment, the implantation may be performed using type of ions, such as As and/or $BF_2$, that may effectively suppress silicon epitaxial growth on top thereof. In addition, the implantation may be performed only shallowly around the top surface of silicon layer 113, by properly controlling the energy level of ions used in the implantation process, upon which epitaxial growth may be performed in a subsequent step.

Figure 3:
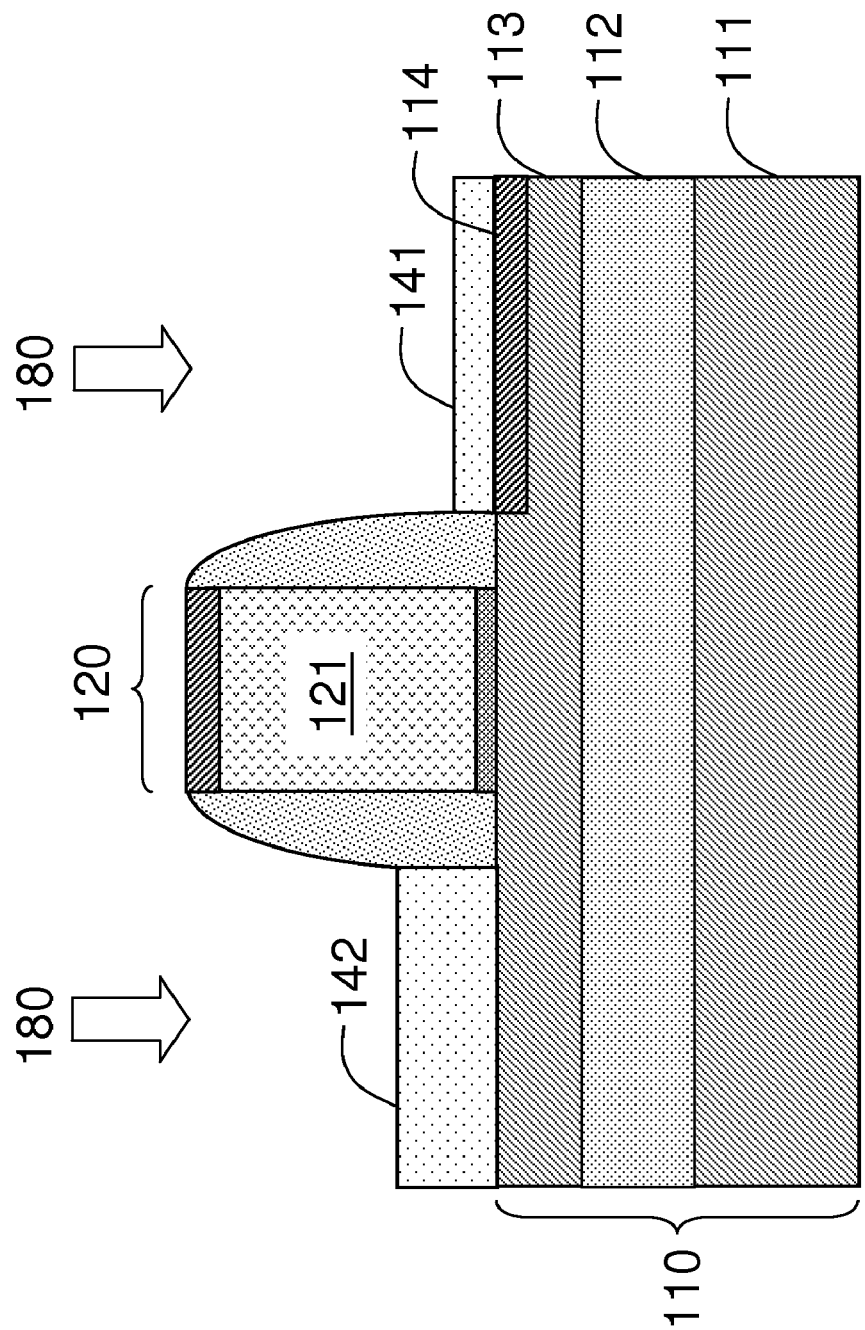
FIG. 3 is a demonstrative illustration of a method of forming a field-effect-transistor with asymmetric height-raised source/drain according to yet another embodiment of the invention.

FIG. 3 is a demonstrative illustration of a method of forming a field-effect-transistor with asymmetric height-raised source/drain according to another embodiment of the invention. Following the angled ion-implantation as shown in FIG. 2, the method may include performing epitaxial growth of, for example, silicon-germanium (SiGe), silicon-carbide (SiC), or other suitable in-site doped materials (depending upon the type of transistor, either pFET or nFET, being formed) to form source and drain of FET 100. More specifically, in the region to the right of gate stack 120 where underlying surface material 114 is pre-treated by angled ion-implantation 170, the rate of epitaxial growth 180 may be dramatically reduced, in comparison to the region to the left of gate stack 120 where epitaxial growth is performed directly on top of silicon layer 113. As a result, a drain region 141 may be formed on top of surface 114. The drain region 141 may have a substantial lower height (profile) than a source region 142 which is formed during the same epitaxial growth to the left of gate stack 120. The lowered height of drain region 141 reduces "carryover" or "fringing" capacitance at the drain side while a relatively high height of source region 142 reduce external resistance in the source side, both of which help improve performance of FET 100 by increasing their operational speed. In the case when spacers 131 and 132 are off-set spacers, asymmetric source/drain extension regions may also be formed.

Other components that may be part of FET 100 may be formed regularly using well-known processes of FEOL, either before or after the formation of asymmetric source/drain regions. Detailed description of their formation is therefore omitted hereinafter in order not to obscure the true essence of present invention.

Figure 4:
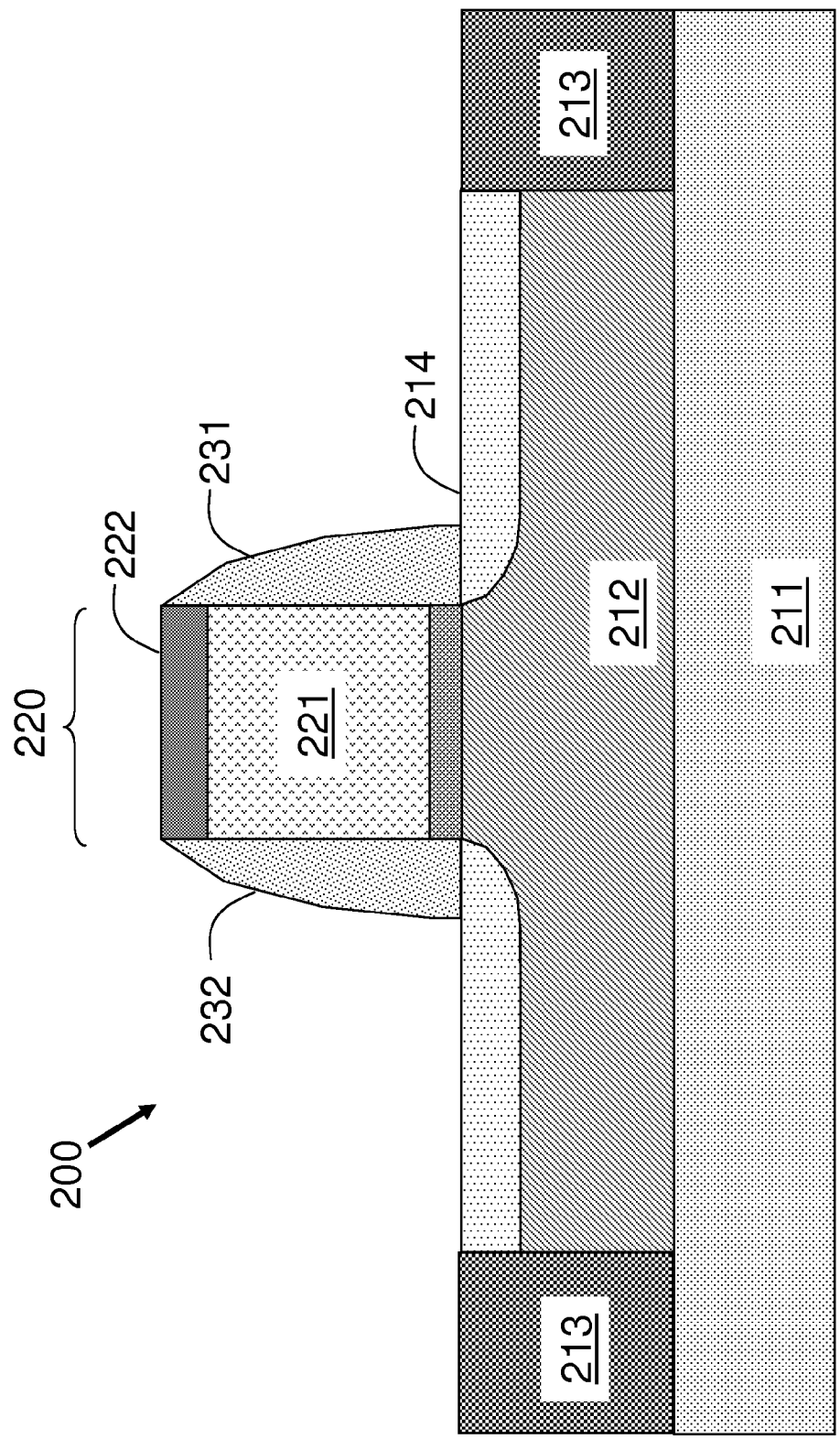
FIG. 4 is a demonstrative illustration of a method of forming a field-effect-transistor with asymmetric source/drain according to an embodiment of the invention.

FIG. 4 is a demonstrative illustration of a method of forming a field-effect-transistor with asymmetric source/drain according to an embodiment of the invention. In this embodiment, for example, the method may include initially providing a semiconductor substrate, which may have for example a "BOX" structure including an insulating layer 211, for example a $SiO_2$ box layer, and a silicon-on-insulator (SOI) layer 212. SOI layer 212 (or silicon layer 212) may be lightly doped with p-type dopant or n-type dopant depending upon the type of FET 200 (either pFET or nFET) to be formed thereupon. In addition, shallow trench insulation (STI) 213 may be formed inside SOI layer 212, at the surrounding of FET 200, to separate FET 200 from adjacent active and/or passive devices which may be formed on the same substrate.

Next, the method may include forming a gate stack 220 on top of SOI layer 212. Gate stack 220 may include a gate dielectric layer, a gate conductor layer 221 and a hardmask layer 222, for example a silicon-nitride (SiN) layer, on top thereof. SiN hardmask layer 222 may be formed to prevent epitaxial growth of silicon on top of gate conductor 221 in subsequent steps of epitaxially growing source and/or drain. Spacers 231 and 232 may next be formed adjacent to sidewalls of gate stack 220. Inside silicon layer 212, source/drain extensions 214 may be formed, which typically refer to doped regions of 214 underneath spacers 231 and 232 and close to gate stack 220.

Figure 5:
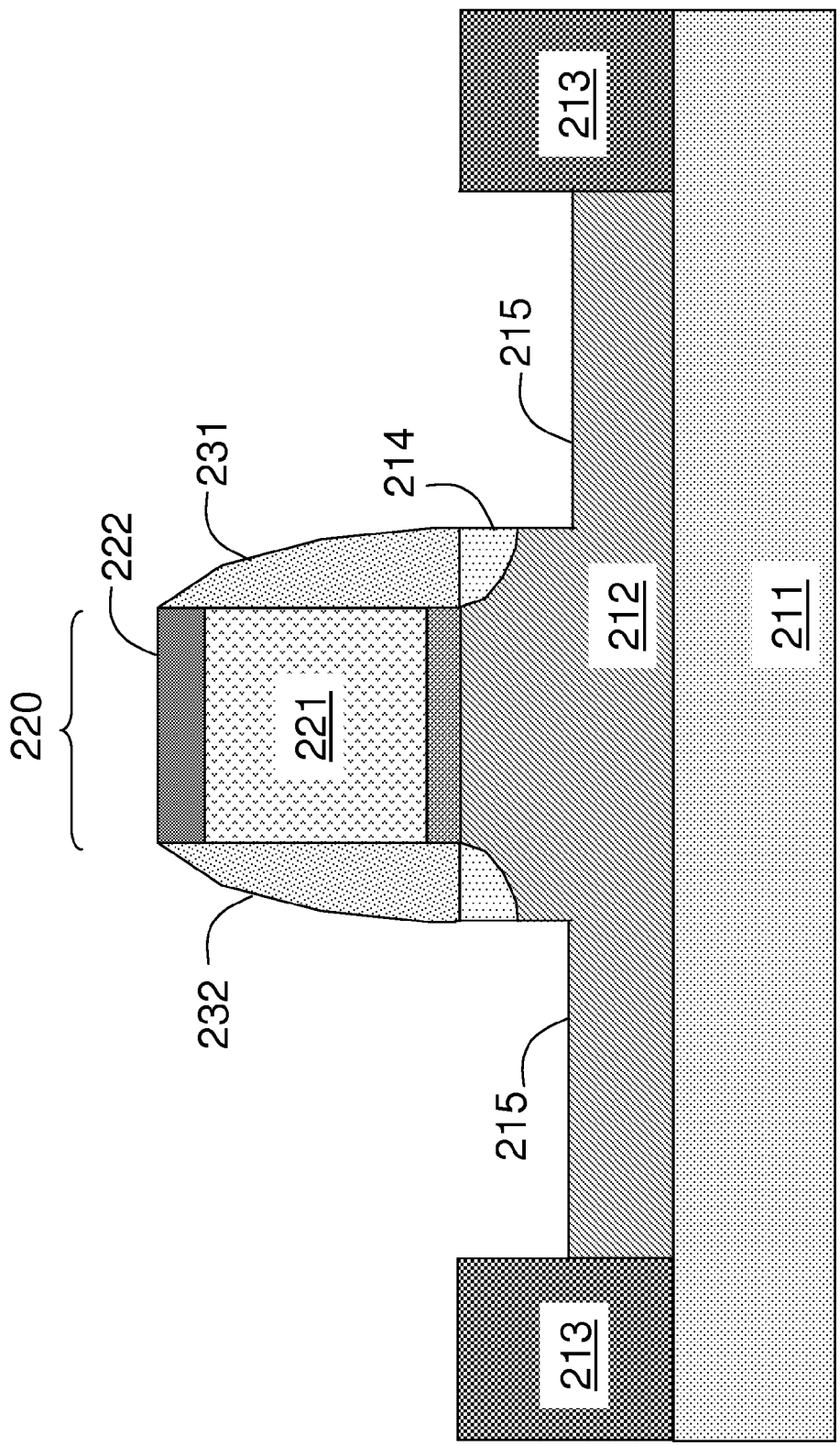
FIG. 5 is a demonstrative illustration of a method of forming a field-effect-transistor with asymmetric source/drain according to another embodiment of the invention.

FIG. 5 is a demonstrative illustration of a method of forming a field-effect-transistor with asymmetric source/drain according to another embodiment of the invention. For example, embodiment of the method may include performing etching of the source and drain regions using spacers 231 and 232 as masks, thereby creating recessed regions 215 inside silicon layer 212. The etching of source and drain regions may be made through a reactive-ion-etching (RIE) process or any other available etching process. The depth of recessed regions 215 is typically deeper than the source/drain extensions 214 and confined between spacers 231/232 and STI 213

Figure 6:
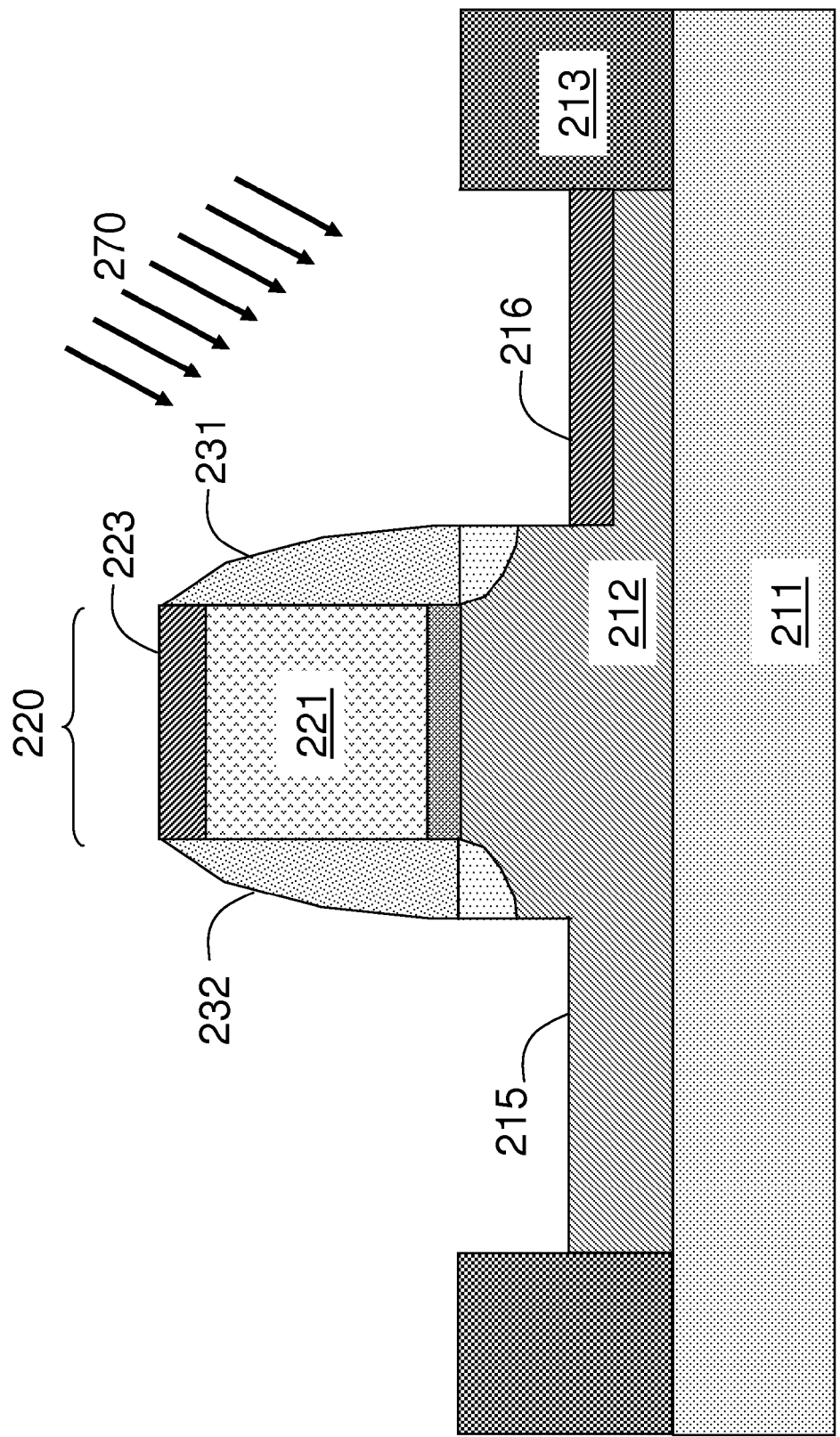
FIG. 6 is a demonstrative illustration of a method of forming a field-effect-transistor with asymmetric source/drain according to yet another embodiment of the invention.

FIG. 6 is a demonstrative illustration of a method of forming a field-effect-transistor with asymmetric source/drain according to another embodiment of the invention. Following the creation of recessed source and drain regions 215 as shown in FIG. 5, embodiment of the method may include performing angled ion-implantation 270 to create ion-implanted regions 216 inside silicon layer 212 at the drain side of gate stack 220. During the ion-implantation process 270, gate stack 220 may be used as a blocking mask and with the implantation being performed at or larger than a certain angle, such as approximately 45 degrees for 20 nm and/or 30 nm nodes applications, source region to the left side of gate stack 220 may experience no or little ion-implantation. The implantation may be performed using type of ions that may effectively suppress silicon epitaxial growth on top thereof such as, for example, by using ions of As and/or $BF_2$. In addition, the implantation may be performed only shallowly around the top surface of silicon layer 212, creating a top surface of ion-implanted region 216 in recessed region 215 to the right of gate stack 220. In the meantime, hardmask layer 222 may become ion-implanted region 223 as well due to ion-implantation.

Figure 7:
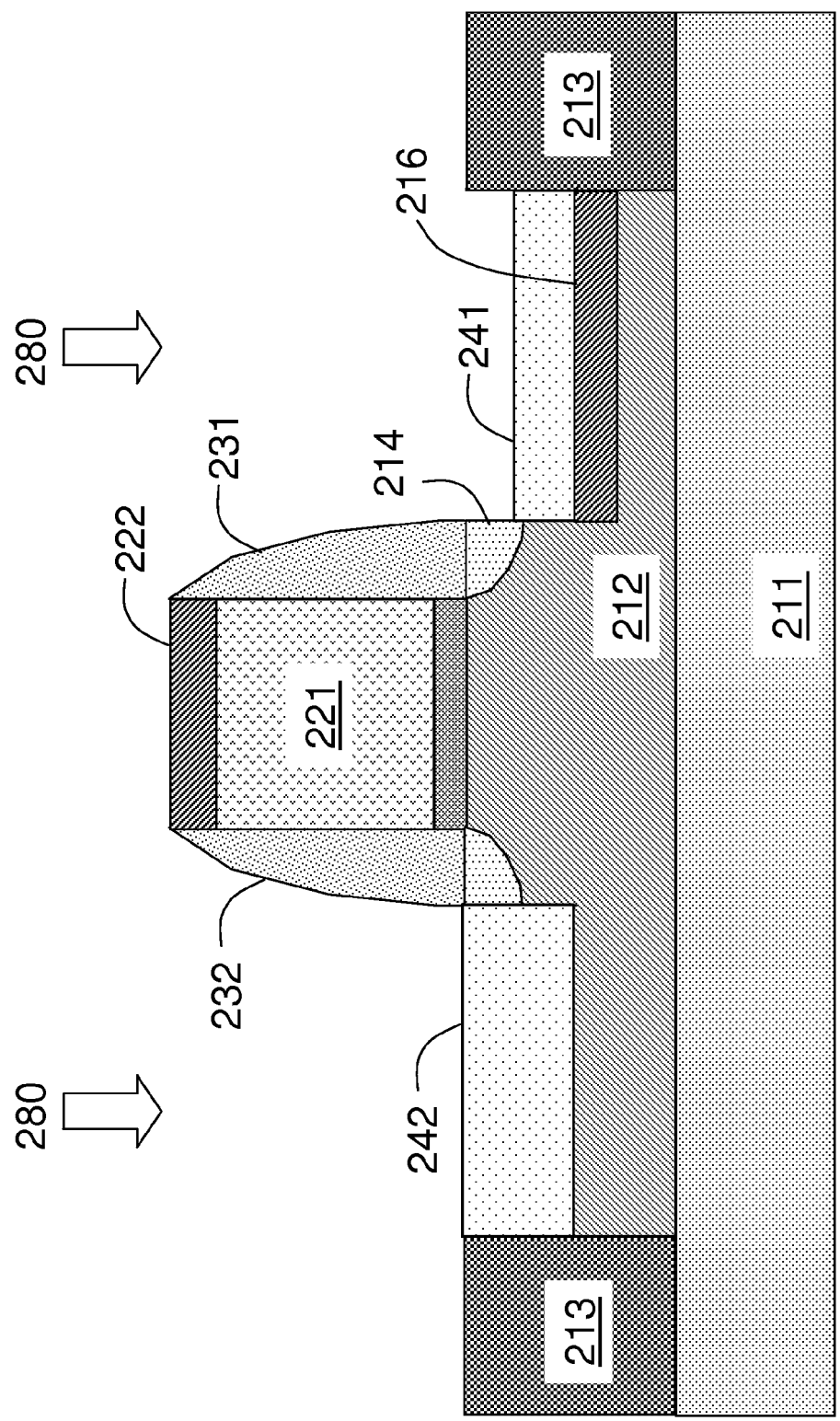
FIG. 7 is a demonstrative illustration of a method of forming a field-effect-transistor with asymmetric source/drain according to yet another embodiment of the invention.

FIG. 7 is a demonstrative illustration of a method of forming a field-effect-transistor with asymmetric source/drain according to yet another embodiment of the invention. Following ion-implantation in the drain side of gate stack 220 as shown in FIG. 6, the method may include performing epitaxial growth 280 of, for example, silicon-germanium (SiGe) material in the recessed regions 215 both to the left side and to the right side of gate stack 220 to form drain and source regions 241 and 242. In addition, it is to be appreciated that embodiment of the present invention is not limited in the above aspect and other materials such as, for example, silicon-carbide may be used in the epitaxial growth depending upon the type of FET being formed.

According to one embodiment, because in the drain region 241 epitaxial growth is performed on top of ion-implanted region 216, the rate of growth of silicon-germanium on top of region 216 may be significantly suppressed to be slower than the epitaxial growth on the source region 242, creating a silicon-germanium layer 241 that has a height less than silicon-germanium layer 242 that is formed to the left side of gate stack 220. In one embodiment, silicon-germanium layer 241 is formed to overlap at least partially with drain extension region 214 underneath spacer 231.

Figure 8:
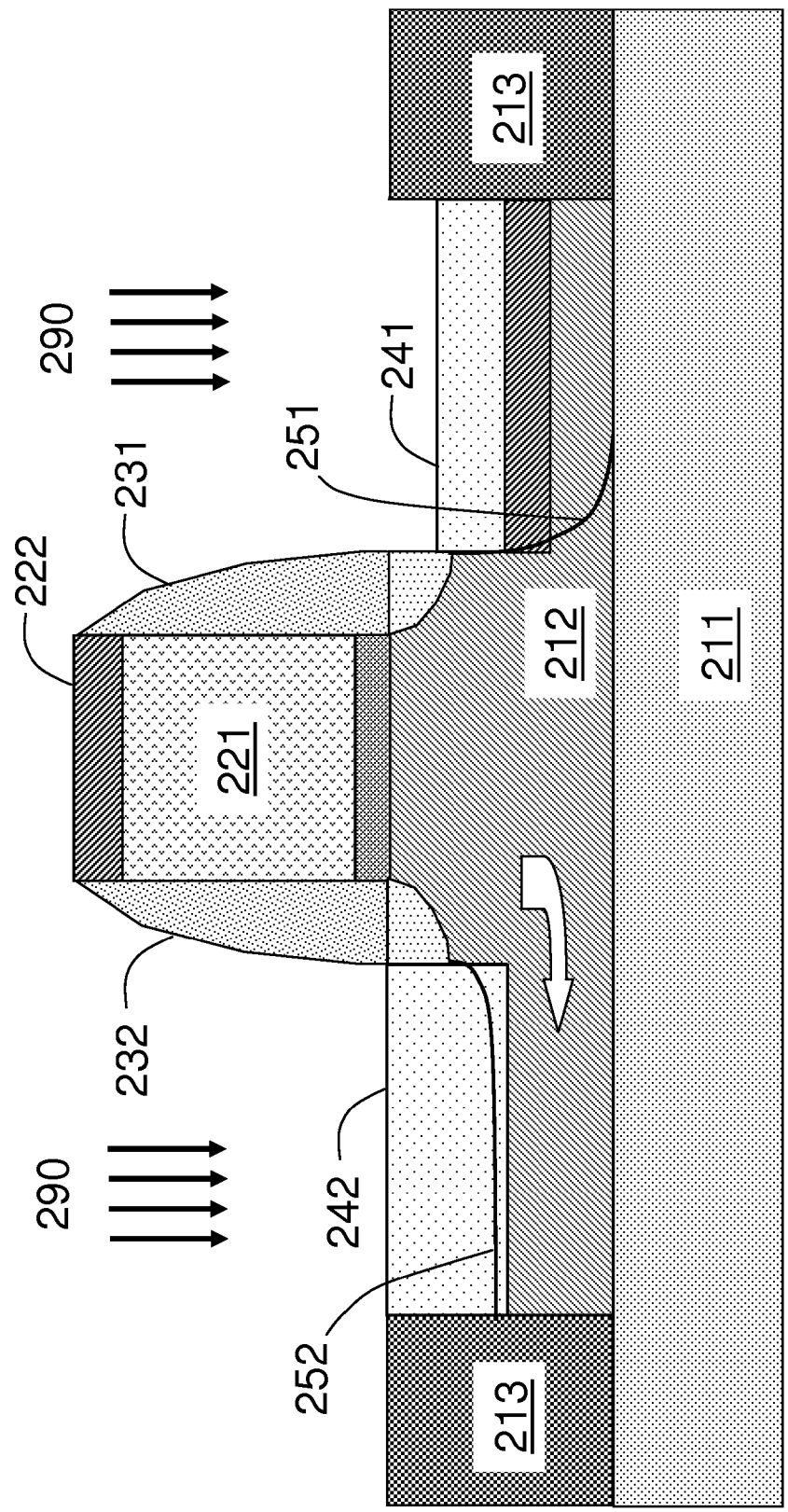
FIG. 8 is a demonstrative illustration of a method of forming a field-effect-transistor with asymmetric source/drain according to yet another embodiment of the invention.

FIG. 8 is a demonstrative illustration of a method of forming a field-effect-transistor with asymmetric source/drain according to yet another embodiment of the invention. For example, after epitaxial growth of silicon-germanium that forms drain and source regions 241 and 242, the method may include performing ion-implantation 290 in regions 241 and 242 to form source and drain of FET 200. According to one embodiment of the present invention, because drain region 241 has a lower profile in thickness (compared with source region 242), ion-implantation 290 may create a P-N junction profile 251 that extends deeper into silicon layer 212 and possibly touches insulating layer 211. P-N junction profile 251 creates almost no passage for leakage current underneath drain 241 and causes a reduction in junction capacitance, thereby improving performance of FET 200. According to another embodiment, the method may create a source region 242 that has a relatively higher profile in thickness (compared with drain region 241), which as a result has a reduced resistance thereby improving performance of FET 200. The P-N junction profile 252 in source region 242 may go less deep into silicon layer 212 and in some instances may be formed inside the silicon-germanium of source region 242.

Figure 9:
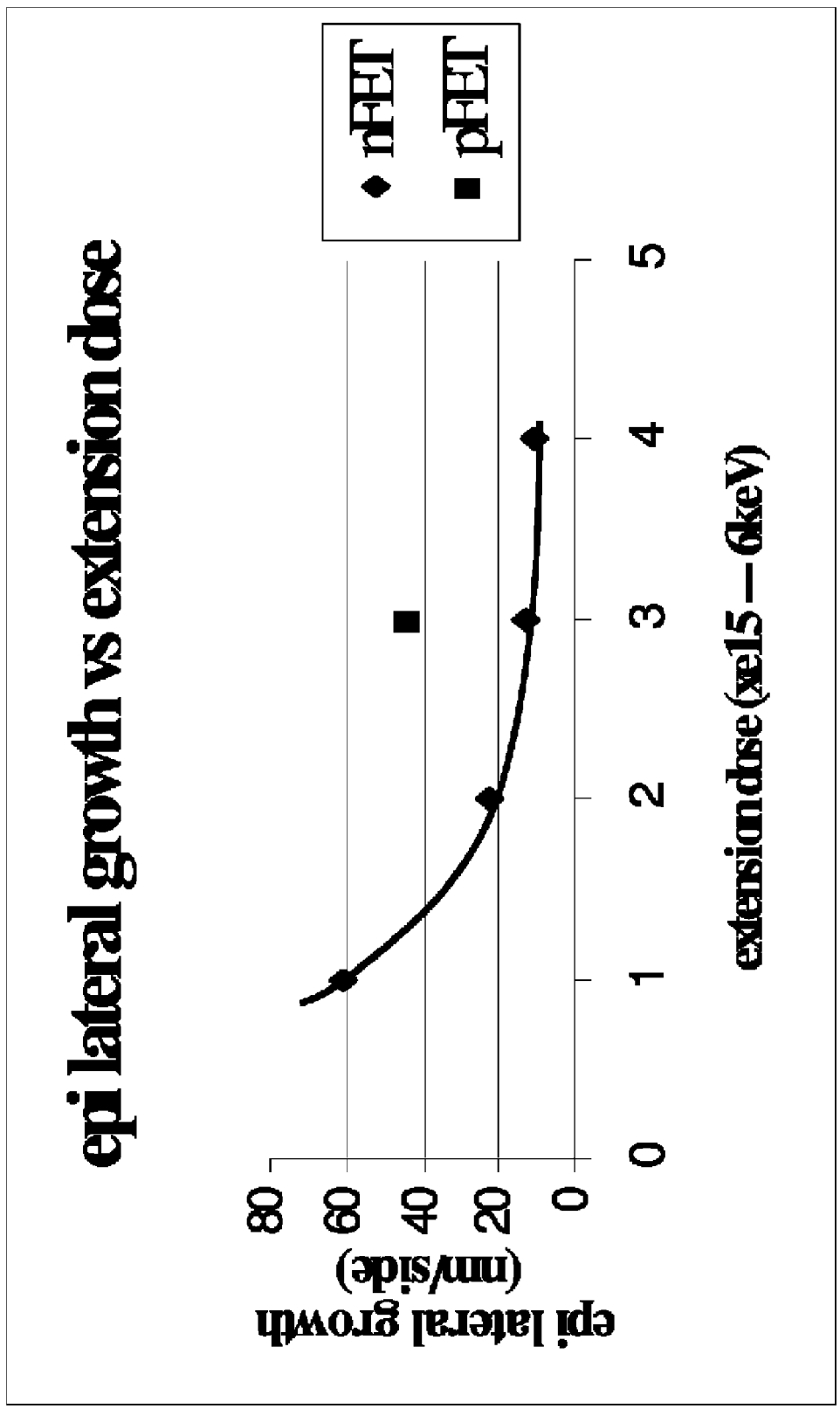
FIG. 9 is a sample illustration of test results of epitaxial growth rate versus dosage of ion-implantation performed according to an embodiment of the invention.

FIG. 9 is a sample illustration of test results of epitaxial growth rate versus dosage of ion-implantation performed according to one embodiment of the invention. Majority of the tests were made, using As dopant, on n-type FET (nFET) and at an energy level around 6 kilo-electron-volt (KeV). From FIG. 9, it is clear that epitaxial growth rates are affected therefore may be effectively controlled during ion-implantation by controlling the level of dosage used. For example, the rate of growth may be reduced dramatically from around 60 nm to around 20 nm when the dosage is doubled from about $1\times10^{15}/cm^2$ to about $2\times10^{15}/cm^2$, and may be further reduced when the dosage is increased to, for example, about $4\times10^{15}/cm^2$. The experimental test results shown in FIG. 9 may be applied, through rate calibration, in controlling the relative difference in thickness of epitaxially grown source and drain regions 241 and 242 of FET 200 as shown in FIG. 7.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A semiconductor structure, comprising:
   a gate structure on top of a semiconductor substrate, said gate structure having a gate stack and spacers at first and second sides of said gate structure;
   a first epitaxially grown region of a first thickness at said first side of said gate structure; and
   a second epitaxially grown region of a second thickness at said second side of said gate structure,
   wherein said second thickness is thicker than said first thickness, and said first epitaxially grown region is formed on top of an ion-implanted region and wherein said first and second epitaxially grown regions are drain region and source region, respectively, of a field-effect-transistor and cover at least a portion of sides of said spacers at the first and second sides of said gate structure.

2. The semiconductor structure of claim 1, wherein said first epitaxially grown region is formed directly on top of said ion-implanted region of said semiconductor substrate implanted with ions of As or $BF_2$, and wherein said second epitaxially grown region is formed directly on top of said semiconductor substrate.

3. A field-effect-transistor comprising:
a gate structure on top of a semiconductor substrate, said gate structure having a gate stack;
a first epitaxially grown region of a first thickness directly on top of said semiconductor substrate at a first side of said gate structure; and
a second epitaxially grown region of a second thickness directly on top of said semiconductor substrate at a second side of said gate structure,
wherein said second thickness is thicker than said first thickness, and said first epitaxially grown region is formed directly on top of an ion-implanted region of said semiconductor substrate.

4. The field-effect-transistor of claim 3, wherein said first epitaxially grown region is formed on top of said ion-implanted region implanted with ions of As or $BF_2$.

5. The field-effect-transistor of claim 3, further comprising a pair of spacers at the first and second sides of said gate structure,
wherein said first and second epitaxially grown regions are drain and source extension regions of said field-effect-transistor, respectively, and cover at least a portion of sides of said spacers at the first and second sides of said gate structure.

6. The field-effect-transistor of claim 3, further comprising a pair of spacers at the first and second sides of said gate structure,
wherein said first and second epitaxially grown regions are drain region and source region, respectively, of said field-effect-transistor, and are formed in recesses created in said substrate to the left and right of said pair of spacers.

7. A semiconductor structure, comprising:
a gate structure on top of a semiconductor substrate, said gate structure having a gate stack and spacers at first and second sides of said gate structure;
a first epitaxially grown region of a first thickness at said first side of said gate structure; and
a second epitaxially grown region of a second thickness at said second side of said gate structure,
wherein said second thickness is thicker than said first thickness, and said first epitaxially grown region is formed on top of an ion-implanted region and wherein said first and second epitaxially grown regions are drain region and source region, respectively, of a field-effect-transistor and are formed in recesses created in said substrate to the left and right of said gate structure.

8. The semiconductor structure of claim 7, wherein said substrate is a silicon-on-insulator (SOI) substrate and wherein a PN-junction formed inside said drain region extends downwardly and is in touch with an insulating layer inside said SOI substrate.

* * * * *